United States Patent
Liu et al.

(10) Patent No.: US 11,059,971 B2
(45) Date of Patent: Jul. 13, 2021

(54) THERMALLY CONDUCTIVE COMPOSITION

(71) Applicant: Dow Silicones Corporation, Midland, MI (US)

(72) Inventors: Zhihua Liu, Shanghai (CN); Peng Wei, Shanghai (CN); Hexiang Yan, Shanghai (CN); Yi Zhao, Shanghai (CN); Qi Chen, Songjiang (CN); Junmin Zhu, Shanghai (CN)

(73) Assignee: Dow Silicones Corporation, Midland, MI (US)

( * ) Notice: Subject to any disclaimer, the term of this patent is extended or adjusted under 35 U.S.C. 154(b) by 0 days.

(21) Appl. No.: 16/629,162

(22) PCT Filed: Sep. 29, 2017

(86) PCT No.: PCT/CN2017/104360
§ 371 (c)(1),
(2) Date: Jan. 7, 2020

(87) PCT Pub. No.: WO2019/061288
PCT Pub. Date: Apr. 4, 2019

(65) Prior Publication Data
US 2020/0308404 A1    Oct. 1, 2020

(51) Int. Cl.
| | | |
|---|---|---|
| *C08L 83/04* | (2006.01) | |
| *C08K 3/013* | (2018.01) | |
| *C08G 77/12* | (2006.01) | |
| *C08G 77/18* | (2006.01) | |
| *C08G 77/20* | (2006.01) | |
| *C08G 77/00* | (2006.01) | |
| *C08K 3/36* | (2006.01) | |

(52) U.S. Cl.
CPC .............. *C08L 83/04* (2013.01); *C08G 77/12* (2013.01); *C08G 77/18* (2013.01); *C08G 77/20* (2013.01); *C08G 77/70* (2013.01); *C08K 3/013* (2018.01); *C08K 3/36* (2013.01); *C08K 2201/001* (2013.01)

(58) Field of Classification Search
CPC ........ C08G 77/12; C08G 77/20; C08G 77/18; C08L 83/04; C08K 2201/001; C08K 3/36; C09D 183/00
See application file for complete search history.

(56) References Cited

U.S. PATENT DOCUMENTS

| | | |
|---|---|---|
| 3,159,601 A | 12/1964 | Ashby |
| 3,220,972 A | 11/1965 | Lamoreaux |
| 3,296,291 A | 1/1967 | Chalk |
| 3,419,593 A | 12/1968 | Willing |
| 3,516,946 A | 6/1970 | Modic |
| 3,814,730 A | 6/1974 | Karstedt |
| 3,989,668 A | 11/1976 | Lee et al. |
| 4,370,358 A | 1/1983 | Hayes et al. |
| 4,707,531 A | 11/1987 | Shirahata |
| 4,766,176 A | 8/1988 | Lee et al. |
| 4,784,879 A | 11/1988 | Lee et al. |
| 5,017,654 A | 5/1991 | Togashi et al. |
| 5,036,117 A | 7/1991 | Chung et al. |
| 5,175,325 A | 12/1992 | Brown et al. |
| 5,310,843 A | 5/1994 | Morita |
| 6,169,142 B1 | 1/2001 | Nakano et al. |
| 6,806,339 B2 | 10/2004 | Cray et al. |
| 8,071,697 B2 | 12/2011 | Frisch et al. |
| 2006/0041064 A1* | 2/2006 | Gornowicz ......... C08L 2666/14 525/104 |
| 2007/0219312 A1 | 9/2007 | David |

FOREIGN PATENT DOCUMENTS

EP    0347895    11/1993

* cited by examiner

*Primary Examiner* — Kuo Liang Peng

(57) ABSTRACT

Provided are a composition, a cured polymer material formed from said composition, a method for forming a thermally conductive material on an article and an article having a thermally conductive material. Said thermally conductive material can be formed on an electronic device, and can be peeled off from said electronic device.

10 Claims, No Drawings

THERMALLY CONDUCTIVE COMPOSITION

FIELD OF THE INVENTION

The present invention relates to thermally conductive compositions. More particularly, the present invention relates to thermally conductive compositions which can be cured on electronics devices, then peeled off from the devices without remaining on the surface of the devices.

BACKGROUND OF THE INVENTION

Electronic components such as semiconductors, transistors, integrated circuits (ICs), discrete devices, light emitting diodes (LEDs), and others known in the art are designed to operate at a normal operating temperature (ex. room temperature) or within a normal operating temperature range. However, the operation of electronic components generate heat. If sufficient heat is not removed, the electronic components will operate at a temperature significantly above its normal operating temperature. Excessive temperature can adversely affect performance of electronic components and operation of the devices associated therewith and negatively impact mean time between failures.

To avoid these problems, heat can be removed by thermal conduction from electronic components to heat sinks. Then, the heat sinks can be cooled by any convenient means such as convection or radiation techniques. For the thermal conduction between electronic components and heat sinks, many thermally conductive materials are proposed and used.

Thermally conductive silicone rubbers or elastomers are used as thermally conductive materials. However, such silicone rubbers and elastomers have been normally cured before they are applied on the surface of electronic devices such as heat sinks or electronic components. Since the surfaces of electronic devices are typically not completely smooth, it is difficult to fully contact the surfaces of electronic devices with the surfaces of thermally conductive silicone rubbers or elastomers. Air spaces appeared between the two surfaces cause insufficient thermal conduction because air has poor thermal conductivity.

Thermally conductive adhesives or thermally conductive greases are also used as thermally conductive materials. Since these materials can fully contact with the surfaces of electronic devices, efficient thermal conduction can be achieved. However, when thermally conductive adhesives are used between two electronic devices (ex. an IC and a heat sink), the two electronic devices are stuck and cannot be peeled off each other. It means that repairing or recycling of these electronic devices are quite difficult. On the other hand, when thermally conducive greases are used, the thermally conductive greases tend to run out from between the two electronic devices during temperature cycling (it is known as "migration out"). In addition, although the two electronic devices can be separated each other, the thermally conductive greases on the surface of the electronic devices are difficult to remove for repair or recycle of these devices.

Thermally conductive gels are also used for thermally conductive materials. Thermally conductive gels typically include a crosslinkable silicone polymer such as vinyl-terminated silicone polymer, a crosslinker such as organohydrogenpolysiloxane and a thermally conductive filler. Before thermally conductive gels are cured, they have properties similar to greases. After thermally conductive gels are cured, the crosslinkable groups in the gels are reacted and the crosslinking reactions provide cohesive strength to prevent the migration out.

Even though thermally conductive gels have many advantages over other thermally conductive materials, there are few thermally conductive gels which can be peeled off from electronic devices without remaining on the surface of the electronic devices. Therefore, there is a need in a thermally conductive material which can fully contact with electronic devices, but can be peeled off from the electronic devices.

SUMMARY OF THE INVENTION

One embodiment of the invention is a composition comprising: (A) 2 to 10 weight % of a polyorganosiloxane which has an average per molecule of at least two unsaturated organic groups, (B) 1 to 10 weight % of organopolysiloxane with 30 to 500 cP of viscosity, (C) 0.01 to 10 weight % of a compound represented by the Formula (I):

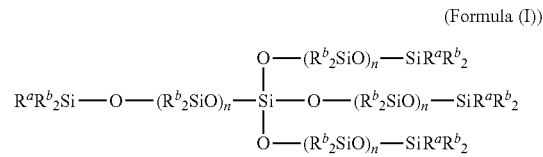

(Formula (I))

wherein each $R^a$ is selected from the group consisting of an alkyl group having 1 to 6 carbon atoms, an alkenyl group having 2 to 6 carbon atoms and an alkynyl group having 2 to 6 carbon atoms, at least three of $R^a$ in the compound are alkenyl group or alkynyl group, each $R^b$ is selected from the group consisting of an alkyl group having 1 to 6 carbon atoms, an alkenyl group having 2 to 6 carbon atoms, an alkynyl group having 2 to 6 carbon atoms, an aryl group, an alkoxy group, an acrylate group and a methacrylate group, and n is an integer from 1 to 100, (D) 1 to 85 weight % of a thermally conductive filler, (E) 0.1 to 5 weight % of an organohydrogenpolysiloxane which has an average of at least two silicone bonded hydrogen atoms, (F) 0.1 to 200 ppm of a catalyst of hydrosilylation reaction and (G) 0.1 to 10 weight % of a reinforcing filler.

Another embodiment of the invention is a cured polymer material contacted on the surface of an article, in which the cured polymer composition is formed from the composition disclosed above.

Further embodiment of the invention is a method for forming a thermally conductive material on an article, comprising the steps of: (a) applying a composition on an article, in which the composition comprises (A) 2 to 10 weight % of a polyorganosiloxane which has an average per molecule of at least two unsaturated organic groups, (B) 1 to 10 weight % of organopolysiloxane with 30 to 500 cP of viscosity, (C) 0.01 to 10 weight % of a compound represented by the Formula (I):

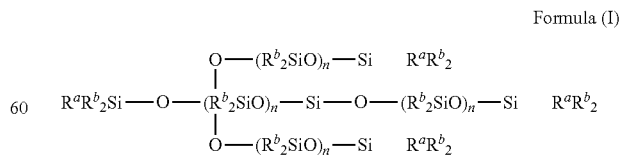

Formula (I)

wherein each $R^a$ is selected from the group consisting of an alkyl group having 1 to 6 carbon atoms, an alkenyl group having 2 to 6 carbon atoms and an alkynyl group having 2 to 6 carbon atoms, at least three of $R^a$ in the compound are alkenyl group or alkynyl group, each $R^b$ is selected from the group consisting of an alkyl group having 1 to 6 carbon atoms, an alkenyl group having 2 to 6 carbon atoms, an alkynyl group having 2 to 6 carbon atoms, an aryl group, an alkoxy group, an acrylate group and a methacrylate group, and n is an integer from 1 to 100, (D) 1 to 85 weight % of a thermally conductive filler, (E) 0.1 to 5 weight % of an organohydrogenpolysiloxane which has an average of at least two silicone bonded hydrogen atoms, (F) 0.1 to 200 ppm of a catalyst of hydrosilylation reaction and (G) 0.1 to 10 weight % of a reinforcing filler, and (b) curing the composition.

Further embodiment of the invention is an article having a thermally conductive material on the surface of the article, in which the thermally conductive material is formed from the composition disclosed above.

DETAILED DESCRIPTION OF THE INVENTION

Composition

The composition of the present invention comprises Ingredients (A), (B), (C), (D), (E), (F) and (G) disclosed below.

Ingredient (A)

Ingredient (A) is a polyorganosiloxane which has an average per molecule of at least two unsaturated organic groups. It is also called as "base polymer" of the composition. The polyorganosiloxane may have a linear or branched structure. The polyorganosiloxane may be a homopolymer or a copolymer. The unsaturated organic groups may be alkenyl exemplified by, but not limited to, vinyl, allyl, butenyl and hexenyl. The unsaturated organic groups may be alkynyl groups exemplified by, but not limited to, ethynyl, propynyl and butynyl. The unsaturated organic groups of the polyorganosiloxane may be located at terminal, pendant, or both terminal and pendant positions of the polyorganosiloxane.

The remaining silicon-bonded organic groups of the polyorganosiloxane may be monovalent organic groups free of unsaturation. These monovalent organic groups may have 1 to 20 carbon atoms, alternatively 1 to 10 carbon atoms, and are exemplified by, but not limited to; alkyl groups such as methyl, ethyl, propyl, pentyl, octyl, undecyl and octadecyl; cycloalkyl groups such as cyclopentyl and cyclohexyl; and aromatic groups such as phenyl, tolyl, xylyl, benzyl and 2-phenylethyl.

Ingredient (A) may be a polyorganosiloxane of

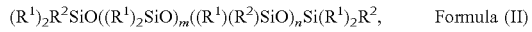   Formula (II)

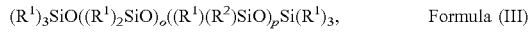   Formula (III)

or a combination thereof.

In Formulas (II) and (III), each $R^1$ is independently a monovalent saturated organic group and each $R^2$ is independently an unsaturated organic group. Subscript m has an average value of at least 2, alternatively subscript m may have a value ranging from 2 to 2000. Subscript n may be 0 or a positive number. Alternatively, subscript n may have an average value ranging from 0 to 2000. Subscript o may be 0 or a positive number. Alternatively, subscript o may have an average value ranging from 0 to 2000. Subscript p has an average value of at least 2. Alternatively subscript p may have an average value ranging from 2 to 2000. Suitable monovalent saturated organic groups for $R^1$ include, but are not limited to; alkyl groups such as methyl group, ethyl group, propyl group, pentyl group, octyl group, undecyl group and octadecyl group; cycloalkyl groups such as cyclo-pentyl group and cyclohexyl group and aryl groups such as phenyl group, tolyl group, xylyl group, benzyl group, and 2-phenylethyl group. Each $R^2$ is independently an unsaturated monovalent organic group. $R^2$ is exemplified by alkenyl groups such as vinyl group, allyl group and butenyl group and alkynyl groups such as ethynyl group and propynyl group.

Examples of Ingredient (A) include, but are not limited to, polydiorganosiloxanes such as dimethylvinylsiloxy-terminated polydimethylsiloxane, dimethylvinylsiloxy-terminated poly(dimethylsiloxane/methylvinylsiloxane), dimethylvinylsiloxy-terminated polymethylvinylsiloxane, trimethylsiloxy-terminated poly(dimethylsiloxane/methylvinylsiloxane), trimethylsiloxy-terminated polymethylvinylsiloxane, dimethylvinylsiloxy-terminated poly(dimethylsiloxane/methylphenylsiloxane), dimethylvinylsiloxy-terminated poly(dimethylsiloxane/diphenylsiloxane), phenyl,methyl,vinyl-siloxy-terminated polydimethylsiloxane, dimethylhexenylsiloxy-terminated polydimethylsiloxane, dimethylhexenylsiloxy-terminated poly(dimethylsiloxane/methylhexenylsiloxane), dimethylhexenylsiloxy-terminated polymethylhexenylsiloxane and trimethylsiloxy-terminated poly(dimethylsiloxane/methylhexenylsiloxane) and a combination thereof.

Methods of preparing polydiorganosiloxane suitable for the use as ingredient (A), such as hydrolysis and condensation of the corresponding organohalosilanes or equilibration of cyclic polydiorganosiloxanes, are well known in the art.

Ingredient (A) can be one organopolysiloxane or a mixture of two or more organopolysiloxane that differ in at least one of the following properties: structure, viscosity, average molecular weight, siloxane units and sequence.

The amount of Ingredient (A) is, basically from 2 to 10 weight %, preferably from 2 to 8 weight %, more preferably from 2 to 6 weight % based on the total weight of the composition.

Ingredient (B)

Ingredient (B) is an organopolysiloxane with 30 to 500 cP of viscosity. It is considered that the organopolysiloxane works as a release agent for a cured polymer material, formed from the composition. Alternatively, it is considered that the organopolysiloxane works as a surface treating agent of a filler, which is optionally added in the composition and disclosed later.

The organopolysiloxane of Ingredient (B) does not react with the polyorganosiloxane of Ingredient (A). The organopolysiloxane of Ingredient (B) may have a linear or branched structure. The organopolysiloxane of Ingredient (B) may be a homopolymer or a copolymer. The organopolysiloxane of Ingredient (B) may have or have not at least one alcoxyl group at the terminal position of the organopolysiloxane.

Ingredient (B) may be an organopolysiloxane of

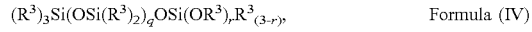   Formula (IV)

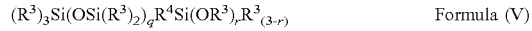   Formula (V)

or a combination thereof.

In Formulas (IV) and (V), each $R^3$ is independently a monovalent saturated organic group. $R^4$ is a divalent saturated organic group. Subscript q has an average value of at least 2, alternatively subscript q may have a value ranging from 2 to 2000. Subscript q is preferably from 10 to 230, more preferably from 20 to 185. Subscript r may be an integer from 0 to 3. Suitable monovalent saturated organic groups for $R^3$ include, but are not limited to, alkyl groups such as methyl group, ethyl group, propyl group, pentyl group, octyl group, undecyl group and octadecyl group; cycloalkyl groups such as cyclopentyl group and cyclohexyl group; and aryl groups such as phenyl group, tolyl group, xylyl group, benzyl group and 2-phenylethyl group. $R^4$ include, but are not limited to, alkylene groups such as methylene group, ethylene group, propylene group, pentylene group, octylene group, undecylene group and octadecylene group; cycloalkylene groups such as cyclopentylene group and cyclohexylene group; and arylene groups such as phenylene group.

Examples of Ingredient (B) include, but are not limited to, $(CH_3)_3Si(OSi(CH_3)_2)nOSi(CH_3)_3$, $C_8H_{17}(CH_3)_2Si(OSi(CH_3)_2)nOSiC_8H_{17}(CH_3)_2$, $C_6H_{13}(CH_3)_2Si(OSi(CH_3)_2)nOSiC_6H_{13}(CH_3)_2$, $C_{10}H_{21}(CH_3)_2Si(OSi(CH_3)_2)nOSiC_{10}H_{21}(CH_3)_2$, $(CH_3)_3SiO(SiO(CH_3)_2)nSi(OCH_3)_3$, $C_8H_{17}(CH_3)_2Si(OSi(CH_3)_2)nOSiC_6H_{12}Si(OCH_3)_3$, $C_6H_{13}(CH_3)_2Si(OSi(CH_3)_2)nOSiC_6H_{12}Si(OCH_3)_3$, $C_{10}H_{21}(CH_3)_2Si(OSi(CH_3)_2)nOSiC_6H_{12}Si(OCH_3)_3$, $C_3H_7(CH_3)_2Si(OSi(CH_3)_2)nOSiC_6H_{12}Si(OCH_3)_3$, $C_6H_{13}(CH_3)_2Si(OSi(CH_3)_2)nOSiC_3H_6Si(OCH_3)_3$, $C_{10}H_{21}(CH_3)_2Si(OSi(CH_3)_2)nOSiC_3H_6Si(OCH_3)_3$, $C_8H_{17}(CH_3)_2Si(OSi(CH_3)_2)nOSiC_3H_6Si(OCH_3)_3$ and $C_3H_7(CH_3)_2Si(OSi(CH_3)_2)nOSiC_3H_6Si(OCH_3)_3$.

Ingredient (B) can be one organopolysiloxane, or a mixture of two or more of organopolysiloxane that differ in at least one of the following properties: structure, viscosity, average molecular weight, siloxane units, and sequence.

The viscosity of the organopolysiloxane of the Ingredient (B) is from 20 to 500 cP. Preferably, the viscosity is from 25 to 500, more preferably from 30 to 350. Lower viscosity organopolysiloxane would be more easily migrate out from a final product. Higher viscosity organopolysiloxane gives worse rework performance.

The amount of Ingredient (B) is, basically from 1 to 10 weight %, preferably from 3 to 8 weight %, more preferably from 3 to 7 weight % based on the total weight of the composition.

Ingredient (C)
Ingredient (C) in the composition of the present invention is a compound represented by the following Formula (I).

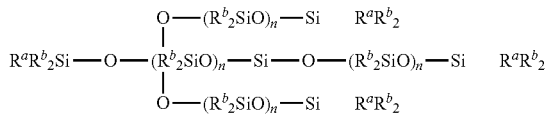

Formula (I)

In Formula (I), each $R^a$ is selected from the group consisting of an alkyl group having 1 to 6 carbon atoms, an alkenyl group having 2 to 6 carbon atoms and an alkynyl group having 2 to 6 carbon atoms. At least three of $R^a$ in the compound are alkenyl group or alkynyl group. Each $R^b$ is selected from the group consisting of an alkyl group having 1 to 6 carbon atoms, an alkenyl group having 2 to 6 carbon atoms, an alkynyl group having 2 to 6 carbon atoms, an aryl group, an alkoxy group, an acrylate group and a methacrylate group. n is an integer from 1 to 100. The compound is disclosed in U.S. Pat. No. 6,806,339B and the description of the document is incorporated. The amount of Ingredient (C) is, basically from 0.01 to 10 weight %, preferably from 0.5 to 5 weight %, more preferably from 0.5 to 3 weight % based on the total weight of the composition.

Ingredient (D)
Ingredient (D) is a thermally conductive filler. The thermally conductive filler includes both an electrically conductive filler and an electrically insulating filler. Ingredient (D) may be selected from the group consisting of aluminum nitride, aluminum oxide, aluminum trihydrate, barium titanate, beryllium oxide, boron nitride, carbon fibers, diamond, graphite, magnesium hydroxide, magnesium oxide, metal particulate, onyx, silicon carbide, tungsten carbide, zinc oxide and a combination thereof. Ingredient (D) may comprise a metallic filler, an inorganic filler, a meltable filler, or a combination thereof. Metallic fillers include particles of metals and particles of metals having layers on the surfaces of the particles. These layers may be, for example, metal nitride layers or metal oxide layers on the surfaces of the particles. Suitable metallic fillers are exemplified by particles of metals selected from the group consisting of aluminum, copper, gold, nickel, silver, and combinations thereof. Suitable metallic fillers are further exemplified by particles of the metals listed above having layers on their surfaces selected from the group consisting of aluminum nitride, aluminum oxide, copper oxide, nickel oxide, silver oxide, and combinations thereof. For example, the metallic filler may comprise aluminum particles having aluminum oxide layers on their surfaces.

Inorganic fillers are exemplified by onyx; aluminum trihydrate, metal oxides such as aluminum oxide, beryllium oxide, magnesium oxide, and zinc oxide; nitrides such as aluminum nitride and boron nitride; carbides such as silicon carbide and tungsten carbide; and combinations thereof. Alternatively, inorganic fillers are exemplified by aluminum oxide, zinc oxide, and combinations thereof. Meltable fillers may comprise Bi, Ga, In, Sn, and an alloy thereof. The meltable filler may optionally further comprise Ag, Au, Cd, Cu, Pb, Sb, Zn, and a combination thereof. Examples of suitable meltable fillers include Ga, In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof. The meltable filler may have a melting point ranging from 50 degrees C. to 250 degrees C., alternatively 150 degrees C. to 225 degrees C. The meltable filler may be an eutectic alloy, a non-eutectic alloy, or a pure metal. Meltable fillers are commercially available.

For example, meltable fillers may be obtained from Indium Corporation of America, Utica, N.Y., U.S.A.; Arconium, Providence, R.I., U.S.A.; and AIM Solder, Cranston, R.I., U.S.A. Aluminum fillers are commercially available, for example, from Toyal America, Inc. of Naperville, Ill., U.S.A. and Valimet Inc., of Stockton, Calif., U.S.A. Silver filler is commercially available from Metalor Technologies U.S.A. Corp. of Attleboro, Mass., U.S.A. Thermally conductive fillers are known in the art and commercially available, see for example, U.S. Pat. No. 6,169,142 (col. 4, lines 7-33). For example, CB-A20S and Al-43-Me are aluminum oxide fillers of differing particle sizes commercially available from Showa-Denko, and AA-04, AA-2, and AA18 are aluminum oxide fillers commercially available from Sumitomo Chemical Company. Zinc oxides, such as zinc oxides having trademarks KADOX® and XX®, are commercially available from Zinc Corporation of America of Monaca, Pa., U.S.A.

The shape of the thermally conductive filler particles is not specifically restricted, however, rounded or spherical particles may prevent viscosity increase to an undesirable level upon high loading of the thermally conductive filler in the composition.

Ingredient (D) may be a single thermally conductive filler or a combination of two or more thermally conductive fillers that differ in at least one property such as particle shape, average particle size, particle size distribution, and type of filler. For example, it may be desirable to use a combination of inorganic fillers, such as a first aluminum oxide having a larger average particle size and a second aluminum oxide having a smaller average particle size. Alternatively, it may be desirable, for example, use a combination of an aluminum oxide having a larger average particle size with a zinc oxide having a smaller average particle size. Alternatively, it may be desirable to use combinations of metallic fillers, such as a first aluminum having a larger average particle size and a second aluminum having a smaller average particle size. Alternatively, it may be desirable to use combinations of metallic and inorganic fillers, such as a combination of aluminum and aluminum oxide fillers; a combination of aluminum and zinc oxide fillers; or a combination of aluminum, aluminum oxide, and zinc oxide fillers. Use of a first filler having a larger average particle size and a second filler having a smaller average particle size than the first filler may improve packing efficiency, may reduce viscosity, and may enhance heat transfer.

The average particle size of the thermally conductive filler will depend on various factors including the type of thermally conductive filler selected for Ingredient (D) and the exact amount added to the curable composition, as well as the bondline thickness of the device in which the cured product of the composition will be used. However, the thermally conductive filler may have an average particle size ranging from 0.1 micrometer to 80 micrometers, alternatively 0.1 micrometer to 50 micrometers, and alternatively 0.1 micrometer to 10 micrometers.

The amount of Ingredient (D) in the composition depends on various factors including the thermal conductivity of the filler selected for Ingredient (D). However, the amount of Ingredient (D) may range from 1% to 85%, alternatively from 30% to 80%, alternatively 50% to 75% by volume of the composition.

Ingredient (E)

Ingredient (E) in the composition is an organohydrogenpolysiloxane which has an average of at least two silicon-bonded hydrogen atoms per molecule. The organohydrogenpolysiloxane can be a homopolymer or a copolymer. The organohydrogenpolysiloxane can have a linear, branched, cyclic, or resinous structure. The silicon-bonded hydrogen atoms in the organohydrogenpolysiloxane can be located at terminal, pendant, or at both terminal and pendant positions.

The organohydrogenpolysiloxane may comprise siloxane units including, but not limited to, $H(R^4)_2SiO_{1/2}$, $(R^4)_3SiO_{1/2}$, $HR^4SiO_{2/2}$, $(R^4)_2SiO_{2/2}$, $R^4SiO_{3/2}$, and $SiO_{4/2}$ units. In the preceding formulae, each $R^4$ is independently selected from monovalent saturated organic groups.

Ingredient (E) may comprise a compound of the formula

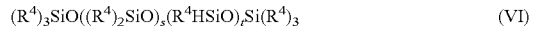

$$(R^4)_3SiO((R^4)_2SiO)_s(R^4HSiO)_tSi(R^4)_3 \quad (VI)$$

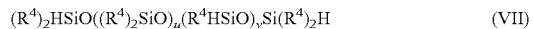

$$(R^4)_2HSiO((R^4)_2SiO)_u(R^4HSiO)_vSi(R^4)_2H \quad (VII)$$

or a combination thereof.

In formulae (VI) and (VII) above, subscript s has an average value ranging from 0 to 2000, subscript t has an average value ranging from 2 to 2000, subscript u has an average value ranging from 0 to 2000, and subscript v has an average value ranging from 0 to 2000. Each $R^4$ is independently a monovalent organic group. Suitable monovalent organic groups include alkyl such as methyl, ethyl, propyl, pentyl, octyl, undecyl and octadecyl; cycloalkyl such as cyclopentyl and cyclohexyl; alkenyl such as vinyl, allyl, butenyl and hexenyl; alkynyl such as ethynyl, propynyl and butynyl; and aryl such as phenyl, tolyl, xylyl, benzyl and 2-phenylethyl.

Examples of the ingredient (E) include, but are not limited to, dimethylhydrogensiloxy-terminated polydimethylsiloxane, dimethylhydrogensiloxy-terminated poly(dimethylsiloxane/methylhydrogensiloxane), dimethylhydrogensiloxy-terminated polymethylhydrogensiloxane, trimethylsiloxy-terminated poly(dimethylsiloxane/methylhydrogensiloxane), trimethylsiloxy-terminated polymethylhydrogensiloxane, a resin consisting essentially of $H(CH_3)_2SiO_{1/2}$ units and $SiO_{4/2}$ units, and a combination thereof.

The organohydrogenpolysiloxane of Ingredient (E) may be a combination of two or more organohydrogenpolysiloxanes that differ in at least one of the following properties: structure, average molecular weight, viscosity, siloxane units, and sequence. Dimethylhydrogensiloxy-terminated polydimethylsiloxanes having relatively low degrees of polymerization (e.g., DP ranging from 3 to 50) are commonly referred to as chain extenders, and a portion of the organohydrogenpolysiloxane may be a chain extender.

Methods of preparing linear, branched, and cyclic organohydrogenpolysiloxanes suitable for use as ingredient (E), such as hydrolysis and condensation of organohalosilanes, are well known in the art. Methods of preparing organohydrogenpolysiloxane resins suitable for use as ingredient (E) are also well known as exemplified in U.S. Pat. Nos. 5,310,843; 4,370,358; and 4,707,531.

The amount of Ingredient (E) in the composition depends on various factors including the SiH content of the organohydrogenpolysiloxane of Ingredient (E), the unsaturated group content of the polyorganosiloxane of Ingredient (A), and the properties of the cured product of the composition desired. However, the amount of Ingredient (E) may be sufficient to provide a molar ratio of SiH groups in the organohydrogenpolysiloxane of Ingredient (E) to unsaturated organic groups in the polyorganosiloxane of Ingredient (A) (commonly referred to as the SiH:Vi ratio) ranging from 0.3:1 to 5:1. Alternatively, the amount of Ingredient (E) may range from 0.1 to 5 weight % based on the composition.

Ingredient (F)

Ingredient (F) of the composition is a catalyst of hydrosilylation reaction. Suitable hydrosilylation catalysts are known in the art and commercially available. The catalyst of Ingredient (F) may comprise a platinum group metal selected from platinum, rhodium, ruthenium, palladium, osmium or iridium metal or organometallic compound thereof, or a combination thereof. Examples of Ingredient (F) include, but are not limited to, chloroplatinic acid, chloroplatinic acid hexahydrate, platinum dichloride, and complexes of said compounds with low molecular weight organopolysiloxanes or platinum compounds microencapsulated in a matrix or coreshell type structure. Complexes of platinum with low molecular weight organopolysiloxanes include 1,3-diethenyl-1,1,3,3-tetramethyldisiloxane complexes with platinum. These complexes may be microencapsulated in a resin matrix. Alternatively, the catalyst may comprise 1,3-diethenyl-1,1,3,3-tetramethyldisiloxane complex with platinum. When the catalyst is a platinum complex with a low molecular weight organopolysiloxane, the amount of catalyst may range from 0.04 to 0.4% based on the weight of the curable silicone composition.

Suitable hydrosilylation catalysts for Ingredient (F) are described in, for example, U.S. Pat. Nos. 3,159,601; 3,220,972; 3,296,291; 3,419,593; 3,516,946; 3,814,730; 3,989,668; 4,784,879; 5,036,117; and 5,175,325 and EP 0 347 895

B. Microencapsulated hydrosilylation catalysts and methods of preparing them are known in the art, as exemplified in U.S. Pat. Nos. 4,766,176; and 5,017,654.

Ingredient (F) is added to the composition in an amount that may range from 0.1 ppm to 1000 ppm, alternatively 1 to 500 ppm, alternatively 2 to 200, alternatively 5 to 150 ppm, by weight of platinum group metal based on the weight of the curable composition.

Ingredient (G)

Ingredient (G) is a filler to reinforce (and/or extend) the cured polymer material. Suitable reinforcing fillers are known in the art. Examples of the filler include, but are not limited to, precipitated, fumed or ground silica, precipitated, fumed or ground calcium carbonate, quartz, talc, chopped fiber such as chopped KEVLAR®, or a combination thereof. In these filler, fumed silica (in situ-prepared treated silica) is preferable. When fumed silica is used as Ingredient (G), its preferable surface area is 50 to 600 $m^2/g$, more preferably from 200 to 400 $m^2/g$. Filler can be used as it is, or can be treated by surface treatment agent such as an alkoxysilane at least partially. Treating agents and treating methods are known in the art, see for example, U.S. Pat. No. 6,169,142 (col. 4, line 42 to col. 5, line 2).

The amount of Ingredient (G) in the composition depends on various factors including the materials selected for Ingredients (A), (B), (C), (D), (E) and (F) and the end use of the composition. However, the amount of Ingredient (G) may range from 0.1% to 10% by weight based on the weight of the composition.

Filler can be added in the composition when all of the ingredients are mixed, or can be mixed with at least one of Ingredients (A), (B), (C), (D), (E) or (F) in advance. Filler can be mixed with Ingredient (A) in advance. Filler can be mixed with Ingredient (A) and form a master batch of Ingredient (G) and Ingredient (A), with the ratio from 60/40 to 90/10 based on the weight.

Optional Ingredients

The composition may optionally further comprise one or more additional ingredients. The additional ingredient may be selected from any known additives such as inhibitor or pigment.

Method of Preparation of the Composition

The composition can be prepared by a method comprising combining all ingredients by any convenient means such as mixing at ambient or elevated temperature. When the composition is prepared at elevated temperature, the temperature during preparation is less than the curing temperature of the composition.

Alternatively, the composition may be prepared as a multiple part composition, for example, when the composition will be stored for a long period of time before use. In the multiple part composition, the Ingredient (E) and the Ingredient (F) are stored in separate parts, and the parts are combined shortly before use of the composition. For example, a two parts curable silicone composition may be prepared by combining ingredients comprising Ingredient (A), Ingredient (F) and Ingredient (D), and one or more additional ingredients in a base part by any convenient means such as mixing. A curing agent part may be prepared by combining ingredients comprising Ingredient (E), Ingredient (A) and Ingredient (D), and one or more additional ingredients by any convenient means such as mixing. The ingredients may be combined at ambient or elevated temperature. When a two part curable silicone composition is used, the weight ratio of amounts of base to curing agent may range from 1:1 to 10:1. One skilled in the art would be able to prepare a curable composition without undue experimentation.

Cured polymer material and a method for forming the cured polymer material One aspect of the invention is a cured polymer material formed from the composition disclosed above. The composition is mixed, then heated to a temperature sufficient to cure the composition, thereby forming a thermal conductive material. The conditions such as heating temperature and time are depends on various factors including the kinds and amounts of Ingredients (A), (B), (C), (D), (E), (F) and (G) and the properties of the cured product of the composition desired, however, for example, the curing can be conducted under 80 to 120 degrees C. for 30 to 60 minutes. Alternatively, the curing can be conducted under 40 to 80 degrees C. for 4 to 10 hours.

The cured polymer material can be formed on an article. Since the composition can be cured on an article, the interface between the surface of the article and the surface of the cured polymer material is fully contacted, with no or quite less air spaces. Therefore, a method for forming a cured polymer material (thermally conductive material) on an article comprises the steps of:

(a) applying the composition disclosed above on an article, and (b) curing the composition to form a cured polymer material.

Article can be an electronic component. Examples of such electronic component include, but are not limited to, from a semiconductor, a transistor, an integrated circuit, a discrete device and a light emitting diode.

Article can be a device to remove heat from an electronic component. Examples of such device include, but are not limited to, a heat sink, a thermally conductive plate, a thermally conductive cover, a fan and a circulating coolant system.

The cured polymer material can be peeled off from an article. For example, the cured polymer material of the present invention can be peeled off from a heat sink or an IC surface without remaining the surface of the heat sink or the IC surface. In addition, the cured polymer material of the present invention can be peeled off from an article, without breaking into two or more pieces.

EXAMPLES

The following raw materials were used to prepare samples in the examples. Ingredient (A-1+G-1) was a mixture of a dimethylvinylsiloxy-terminated polydimethylsiloxane having a viscosity of 64 Pa·s and a treated fumed silica at weight ratio of 74:26. Ingredient (A-2) was a dimethylvinylsiloxy-terminated polydimethylsiloxane having a viscosity of 55,000 cP. Ingredient (A-3) was a dimethylvinylsiloxy-terminated polydimethylsiloxane having a viscosity of 450 cP. Ingredient (B-1) was a mixture of a mono-trimethoxysiloxy terminated polydimethylsiloxane, a mono dimethylbutylsiloxy- and mono trimethoxysiloxy-terminated polydimethylsiloxane and a trimethylsiloxy-terminated polydimethylsiloxane, having 124 cP of viscosity. Ingredient (B-2) was a mixture of a di(n-octyldimethylsiloxy) terminated polydimethylsiloxane, a mono trimethoxysilylhexyldimethylsiloxy- and mono octyldimethylsiloxy-terminated polydimethylsiloxane and a di(trimethoxysilylhexyl) terminated polydimethylsiloxane having a viscosity of 30 cP. Ingredient (B-3) was a di(trimethoxysilyl) terminated polydimethylsiloxane having a viscosity of 100 cP. Ingredient (B-4) was a di(trimethoxysilyl) terminated polydimethylsiloxane having a viscosity of 350 cP. Ingredient (C-1)

was a dimethyl cyclics with tetrakis (vinyldimethylsiloxy) silane. Ingredient (C'-1) was silicic acid, sodium salt, reaction products with chlorotrimethylsilane and iso-propyl alcohol (MQ resin). Ingredient (C'-2) was dimethylvinylated trimethylated silica (MQ vinyl resin). Ingredient (C'-3) was a vinyl terminated polymer with 250 cP. Ingredient (D-1) was alumina particles having an average particle size (D50) of 2 μm. Ingredient (D-2) was alumina particles having D50 of 10 μm. Ingredient (E-1) was a trimethylsiloxy-terminated dimethyl, methylhydrogenpolysiloxane having a viscosity of 19 cP. Ingredient (E-2) was a trimethylsiloxy-terminated dimethyl, methylhydrogenpolysiloxane. the ratio (wt %) of hydrogen atom of SH group in the molecule is 0.85%. Ingredient (F-1) was a mixture of a 1,3-diethenyl-1,1,3,3-tetramethyldisiloxane complex with platinum and a dimethylsiloxane with phenyl silsesquioxane, 0.4 wt % of platinum. Ingredient (F-2) was 40% content of the Ingredient (F-1).

Examples 1 to 3 and Comparative Examples 1 to 5

The law materials listed in Tables 1 and 2 were added in a reaction vessel with a mixer. These raw materials were mixed at 25° C. for 2 minutes under 1500 rpm. The obtained mixture (composition) was applied on a surface of test substrates to make test samples. Three test substrates, i.e. aluminum substrate, glass substrate and a PCB panel with aluminum flame were used. Then the test samples were cured at 100° C. for 45 minutes in an oven, whereby the compositions on the test substrates were cured and formed thermally conductive materials. Rework performance test was conducted for each test samples.

Rework Performance Test

The cured compositions (thermally conductive materials) were peeled off from the substrates by hand. When a thermally conductive material was peeled off from a substrate without broken into pieces, its rework performance was shown as "1". When a thermally conductive material was broken into two pieces or more, its rework performance was shown as "2". The rework performance test results are added in Tables 1 and 2.

TABLE 1

| Law materials | Examples | | |
|---|---|---|---|
| | 1 | 2 | 3 |
| A-1 + G-1 | 6.461 | 6.161 | 6.446 |
| A-2 | 2.400 | 2.400 | 2.391 |
| A-3 | — | — | 0.120 |
| B-1 | — | 6.975 | — |
| B-2 | 6.975 | — | — |
| B-3 | — | — | 4.244 |
| B-4 | — | — | 2.714 |
| C-1 | 1.320 | 1.320 | 1.317 |
| D-1 | 27.300 | 27.300 | 27.236 |
| D-2 | 54.700 | 54.700 | 54.572 |
| E-1 | 0.708 | 0.708 | 0.709 |
| F-1 | 0.200 | — | 0.200 |
| F-2 | — | 0.500 | — |
| Pigment | 0.050 | 0.050 | 0.050 |
| Inhibitor | 0.120 | 0.120 | 0.0006 |
| Total | 100.234 | 100.234 | 100.000 |
| Rework on Glass | 1 | 1 | 1 |
| Rework on Al | 1 | 1 | 1 |
| Rework on PCB + Al | 1 | 1 | 1 |

TABLE 2

| Law materials | Comparative examples | | | | |
|---|---|---|---|---|---|
| | 1 | 2 | 3 | 4 | 5 |
| A-1 | 6.446 | — | 6.446 | 4.000 | 6.446 |
| A-2 | 2.102 | 7.966 | 0.500 | 5.900 | 2.589 |
| A-3 | 22.028 | 0.96 | 2.330 | 0.120 | 0.225 |
| B-1 | 6.959 | 6.959 | 5.000 | 6.959 | 6.959 |
| B-2 | — | — | — | — | — |
| C-1 | — | 1.317 | — | — | — |
| C'-1 | — | — | 4.657 | — | — |
| C'-2 | — | — | — | 0.450 | — |
| C'-3 | — | — | — | — | 1.317 |
| D-1 | 27.236 | 27.236 | 27.236 | 27.236 | 27.236 |
| D-2 | 54.572 | 54.572 | 54.572 | 54.572 | 54.572 |
| E-1 | 0.355 | 0.710 | 0.355 | 0.446 | 0.355 |
| E-2 | 0.051 | — | 0.051 | 0.063 | 0.051 |
| F-1 | 0.200 | 0.200 | 0.200 | 0.200 | 0.200 |
| F-2 | — | — | — | — | — |
| Pigment | 0.050 | 0.050 | 0.050 | 0.050 | 0.050 |
| Inhibitor | 0.0006 | 0.0006 | 0.0006 | 0.0006 | 0.0006 |
| Total | 100.000 | 100.000 | 101.40 | 100.00 | 100.00 |
| Rework on Glass | 1 | 1 | 1 | 1 | 1 |
| Rework on Al | 1 | 1 | 1 | 1 | 1 |
| Rework on PCB + Al | 2 | 2 | 2 | 2 | 2 |

What is claimed is:

1. A composition comprising (A) 2 to 10 weight % of a polyorganosiloxane which has an average per molecule of at least two unsaturated organic groups, (B) 3 to 8 weight % of organopolysiloxane with 30 to 500 cP of viscosity, where the organopolysiloxane has the following structure:

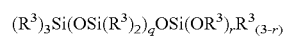

$(R^3)_3Si(OSi(R^3)_2)_qOSi(OR^3)_rR^3_{(3-r)}$ where $R^3$ is independently a monovalent saturated organic group, subscript q has an average value of at least 2, and r is an integer from 0 to 3;

(C) 0.01 to 10 weight % of a compound represented by the Formula (I)

(Formula (I))

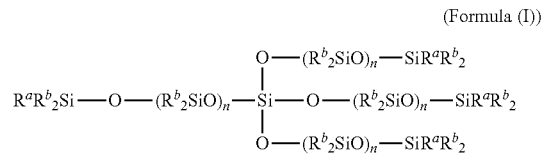

wherein each $R^a$ is selected from the group consisting of an alkyl group having 1 to 6 carbon atoms, an alkenyl group having 2 to 6 carbon atoms and an alkynyl group having 2 to 6 carbon atoms, at least three of $R^a$ in the compound are alkenyl group or alkynyl group, each $R^b$ is selected from the group consisting of an alkyl group having 1 to 6 carbon atoms, an alkenyl group having 2 to 6 carbon atoms, an alkynyl group having 2 to 6 carbon atoms, an aryl group, an alkoxy group, an acrylate group and a methacrylate group, and n is an integer from 1 to 100, (D) 1 to 85 weight % of a thermally conductive filler, (E) 0.1 to 5 weight % of an organohydrogenpolysiloxane which has an average of at least two silicone bonded hydrogen atoms, (F) 0.1 to 200 ppm of a catalyst of hydrosilylation reaction and (G) 0.1 to 10 weight % of a reinforcing filler.

2. The composition of claim 1, wherein the organopolysiloxane has at least one hydroxyl alkyl group.

3. The composition of claim 1, wherein the reinforcing filler is a silica powder.

4. The composition of claim 3, wherein the silica powder is mixed with the polyorganosiloxane which has an average per molecule of at least two unsaturated organic groups.

5. The composition of claim 1, further comprises organopolysiloxane which has at least one vinyl group at the end of the organopolysiloxane structure.

6. A cured polymer material contacted on the surface of an article, in which the cured polymer composition is formed from the composition of claim 1.

7. A method for forming a thermally conductive material on an article, comprising the steps of:

(a) applying a composition on an article, in which the composition comprises (A) 2 to 10 weight % of a polyorganosiloxane which has an average per molecule of at least two unsaturated organic groups, (B) 3 to 8 weight % of organopolysiloxane with 30 to 500 cP of viscosity, where the organopolysiloxane has the following structure:

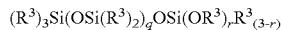

where $R^3$ is independently a monovalent saturated organic group, subscript q has an average value of at least 2, and r is an integer from 0 to 3;

(C) 0.01 to 10 weight % of a compound represented by the Formula (I)

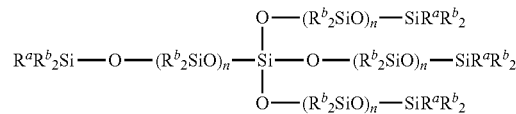

wherein each $R^a$ is selected from the group consisting of an alkyl group having 1 to 6 carbon atoms, an alkenyl group having 2 to 6 carbon atoms and an alkynyl group having 2 to 6 carbon atoms, at least three of $R^a$ in the compound are alkenyl group or alkynyl group, each $R^b$ is selected from the group consisting of an alkyl group having 1 to 6 carbon atoms, an alkenyl group having 2 to 6 carbon atoms, an alkynyl group having 2 to 6 carbon atoms, an aryl group, an alkoxy group, an acrylate group and a methacrylate group, and n is an integer from 1 to 100, (D) 1 to 85 weight % of a thermally conductive filler, (E) 0.1 to 5 weight % of an organohydrogenpolysiloxane which has an average of at least two silicone bonded hydrogen atoms, (F) 0.1 to 200 ppm of a catalyst of hydrosilylation reaction and (G) 0.1 to 10 weight % of a reinforcing filler, and (b) curing the composition.

8. The method of claim 7, wherein the curing step is conducted under 80 to 120 degrees C. for 30 to 60 minutes, or 40 to 80 degrees C. for 4 to 10 hours.

9. An article having a thermally conductive material on the surface of the article, in which the thermally conductive material is formed from the composition of claim 1.

10. The article of claim 9, the article is selected from a semiconductor, a transistor, an integrated circuit, a discrete device, a light emitting diode, a heat sink, a thermally conductive plate, a thermally conductive cover, a fan or a circulating coolant system.

* * * * *